United States Patent
Hembree (10) Patent No.: US 10,068,875 B2
(45) Date of Patent: Sep. 4, 2018

(54) APPARATUSES AND METHODS FOR HEAT TRANSFER FROM PACKAGED SEMICONDUCTOR DIE

(71) Applicant: MICRON TECHNOLOGY, INC., Boise, ID (US)

(72) Inventor: David R. Hembree, Boise, ID (US)

(73) Assignee: Micron Technology, Inc., Boise, ID (US)

(*) Notice: Subject to any disclaimer, the term of this patent is extended or adjusted under 35 U.S.C. 154(b) by 12 days.

(21) Appl. No.: 14/920,394

(22) Filed: Oct. 22, 2015

(65) Prior Publication Data
US 2017/0117254 A1  Apr. 27, 2017

(51) Int. Cl.
*H01L 25/065* (2006.01)
*H01L 23/38* (2006.01)
*H01L 21/56* (2006.01)
*H01L 25/18* (2006.01)

(52) U.S. Cl.
CPC ........ *H01L 25/0657* (2013.01); *H01L 21/563* (2013.01); *H01L 23/38* (2013.01); *H01L 25/18* (2013.01); *H01L 2224/0557* (2013.01); *H01L 2224/06181* (2013.01); *H01L 2224/16145* (2013.01); *H01L 2224/26145* (2013.01); *H01L 2224/2919* (2013.01); *H01L 2224/2929* (2013.01); *H01L 2224/29309* (2013.01); *H01L 2224/29344* (2013.01); *H01L 2224/32145* (2013.01); *H01L 2224/73204* (2013.01); *H01L 2224/92125* (2013.01); *H01L 2225/0652* (2013.01); *H01L 2225/06517* (2013.01); *H01L 2225/06541* (2013.01); *H01L 2225/06555* (2013.01); *H01L 2225/06565* (2013.01); *H01L 2225/06589* (2013.01); *H01L 2924/1431* (2013.01); *H01L 2924/1434* (2013.01);
(Continued)

(58) Field of Classification Search
CPC ..... H01L 27/16; H01L 23/34; H01L 23/4012; H01L 23/42; H01L 2023/34; H01L 2023/4043; H01L 25/043; H01L 25/0657; H01L 2225/06503; H01L 2925/0655; H01L 21/563
USPC .......... 257/686, 706, 712, 713, 777, E27.008
See application file for complete search history.

(56) References Cited

U.S. PATENT DOCUMENTS

| 5,229,327 A | 7/1993 | Farnworth |
| 7,279,796 B2 | 10/2007 | Hu et al. |
| 7,589,417 B2 | 9/2009 | Ramanathan et al. |

(Continued)

OTHER PUBLICATIONS

Bar-Cohen, Avram et al., "On-chip Hot Spot Remediation with Miniaturized Thermoelectric Coolers", Microgravity Sci. Technol (2009) 21 (Suppl 1):S351-S359, DOI 10.1007/s12217-009-9162-4, Received: Mar. 24, 2009 / Accepted: Jul. 6, 2009 / Published online: Jul. 24, 2009 © Springer Science + Business Media B.V. 2009, 2009, 9 pgs.

(Continued)

*Primary Examiner* — Daniel Whalen
(74) *Attorney, Agent, or Firm* — Dorsey & Whitney LLP (57) ABSTRACT

Apparatuses and methods for heat transfer from packaged semiconductor die are described. For example, an apparatus may include a plurality of die in a stack, and a barrier in close proximity to at least an edge of each of the plurality of die. The apparatus may further include fill material in spaces between adjacent die of the plurality of die and in between the plurality of die and the barrier.

23 Claims, 4 Drawing Sheets

(52) U.S. Cl.
CPC ............... *H01L 2924/1659* (2013.01); *H01L 2924/16251* (2013.01)

(56) References Cited

U.S. PATENT DOCUMENTS

| | | | |
|---|---|---|---|
| 2010/0224990 A1* | 9/2010 | Suh | H01L 21/76898 257/712 |
| 2010/0230805 A1* | 9/2010 | Refai-Ahmed | H01L 23/10 257/712 |
| 2011/0147916 A1* | 6/2011 | Su | H01L 21/54 257/692 |
| 2011/0272692 A1* | 11/2011 | Han | H01L 23/367 257/48 |
| 2013/0082399 A1* | 4/2013 | Kim | H01L 24/19 257/774 |
| 2013/0099368 A1* | 4/2013 | Han | H01L 23/473 257/692 |
| 2013/0119528 A1* | 5/2013 | Groothuis | H01L 23/36 257/690 |
| 2013/0175706 A1* | 7/2013 | Choi | H01L 25/074 257/777 |
| 2013/0344655 A1* | 12/2013 | Ohba | H01L 23/3114 438/109 |
| 2014/0015598 A1* | 1/2014 | Groothuis | H01L 23/3128 327/524 |
| 2014/0138819 A1* | 5/2014 | Choi | H01L 21/02107 257/737 |
| 2014/0367844 A1* | 12/2014 | Hooper | H01L 23/36 257/712 |
| 2015/0130078 A1* | 5/2015 | Hong | H01L 23/34 257/774 |
| 2015/0170991 A1* | 6/2015 | Li | H01L 25/0657 257/777 |
| 2015/0279431 A1* | 10/2015 | Li | H01L 25/50 365/51 |
| 2015/0333026 A1* | 11/2015 | Gandhi | H01L 23/4012 257/737 |
| 2015/0348954 A1* | 12/2015 | Chandolu | H01L 25/50 257/712 |
| 2016/0330854 A1* | 11/2016 | Tucker | H05K 7/026 |

OTHER PUBLICATIONS

Snyder, Jeffrey et al., "Hot Spot Cooling using Embedded Thermo-electric Coolers", 22nd IEEE Semi-Therm Symposium, 2006, 9 pgs.

Yang, Bao et al., "Thermoelectric Mini-Contact Cooler for Hot-Spot Removal in High Power Devices", 2006 Electronic Components and Technology Conference © 2006 IEEE, 2006, 997-1002.

* cited by examiner

APPARATUSES AND METHODS FOR HEAT TRANSFER FROM PACKAGED SEMICONDUCTOR DIE

BACKGROUND

The evolution of electronics is forcing component manufacturers to develop smaller devices while providing greater functionality and speed. The combination of these size and operational goals may lead to increases in internal heat generation. The increase in heat generation may be due to obstructed or inefficient thermal paths in combination with higher operating power consumption. For the components to continue to provide the performance desired, the extra heat may need to be dissipated. At a time when components (and the systems including the components) were larger, dissipation of any extra heat may have been more easily accomplished due to heat dissipating bulk materials and/or the air flow around the components. Currently, however, small, high speed devices and components containing multiple die may benefit from packaging that provides higher thermal conductivity paths for dissipating the heat generated within such devices.

DETAILED DESCRIPTION

Apparatuses and methods for heat transfer from packaged semiconductor die are disclosed herein. Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

As noted, thermal management of semiconductor devices is an ever increasing concern and due in part to combinations of device size and power consumption. Other factors may also contribute to thermal concerns, such as multiple die packaged together, die stacks for example. Heat extraction barriers such as multiple interfaces may contribute to the problems of packaged stacks of semiconductor die. At elevated operating levels, the overall heat generated by a stack of die will increase. Such an increase in heat generation is due to the proximity of several stacked die exacerbating heat conduction and adding to an operating environment at an elevated temperature. For example, a stack of die may present a difficult heat extraction configuration due to the multiple interfaces heat may need to travel through before reaching an external surface of the package for dissipation. Additionally, lateral heat extraction may also be limited due to die packaging processes and materials. The additional heat, if not efficiently removed from the stack of die, may cause one or more die in the stack to experience temperatures above their specified limits. Such thermal problems may lead to a malfunctioning or inoperable package.

Additionally, the packaging process and the packaging materials may further impair heat transfer. For example, one or more materials included in the packaging process may move, e.g., flow, from their desired location to an undesired location during the fabrication process. The flow of the one or more materials may be due to their physical characteristics, such as viscosity and capillary action. The one or more materials may also be characterized by relatively poor thermal conductivity characteristics. Thus, the combination of the one or more materials flowing into an undesirable location and their relatively poor thermal conductivity may reduce the overall thermal dissipation of packaged stacks of semiconductor die.

Figure 1:
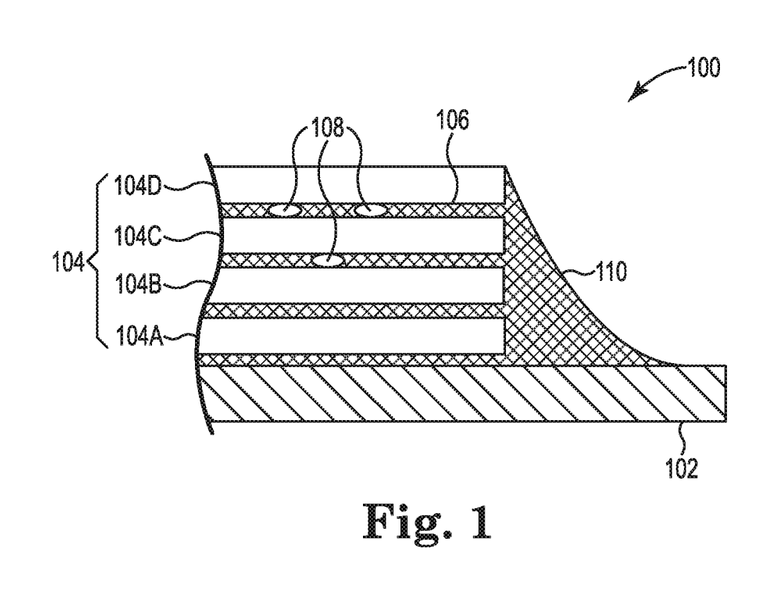
FIG. 1 is an example illustration of a die stack according to the present disclosure.

FIG. 1 is an example illustration of a die stack 100 in accordance with the present disclosure. The die stack 100 includes a die 102 and a plurality of die 104. The plurality of die 104 includes individual dies 104A, 10413, 1040, and 104D. The number of die depicted in FIG. 1 is for illustrative purposes only, and any number of die falls within the scope of the present disclosure. The die stack 100 may also include an under fill material 106, which may have been included during one or more packaging process steps. The die stack 100 may represent a packaged die stack or a die stack that has been partially packaged and may be used to illustrate one or more potential problems associated with packaged die stacks. Additional packaging materials are not shown so as not to obscure aspects of the partially packaged die stack 100 that are to be discussed with respect to FIG. 1. The additional packaging aspects may be depicted in FIGS. 2 and/or 3 and will be discussed in more detail below.

The die 102 and the plurality of die 104 may be any semiconductor die. For example, the die 102 may be a logic die and the plurality of die 104 may be memory die, such as volatile, non-volatile, or combinations thereof. The die 102, 104 may be electrically and physically coupled through one or more metallic bonds that may have been formed during one or more packaging process steps. For example, each of the die 102, 104 may have one or more bonding pad sites formed on a top and/or bottom side of the die 102, 104 that may have the one or more metallic bonds formed thereon so that the die in the stack may be bonded to adjacent die that are above and/or below. After the metallic bonds are formed, each of the die 102 and 104 may be separated from adjacent die by around 30 to 50 microns, e.g., spacing may occur between the die. For example, after bond formation, the space between the die 102 and the die 104A may be about 30 microns. The space between each of the die 102, 104, for example, may be at least partially due to the size of the metallic bonds coupling the die of the die stack 100. The cause of the spacing, however, is not a limiting aspect of the present disclosure.

The under fill material 106 may be viscous material that, when cured, may provide structural support to the die stack 100, for example. In some embodiments, the under fill material 106 may also provide heat dissipation pathways for the die stack 100. The thermal conductivity of the under fill material 106 may be greater than air, for example. The under fill material 106 may be applied and formed during one or more packaging process steps. The under fill material 106 may be dispensed along or on the vertical sides of the die 104 and onto die 102 and subjected to one or more processes enabling the under fill material 106 to penetrate and fill the spaces between the die 102, 104. For example, the under fill material 106 may fill the spaces between the die 102, 104 due to a capillary effect. A subsequent heating step may be used to cure the under fill material 106.

The under fill material 106, however, may in some instances wick out from the spaces between the die 102, 104 and pool at a base of the die 104 and on top of at least a portion of the die 102. The wicking and pooling of the under fill material 106 may lead to the formation of pool 110, e.g., fillet, of the under fill material 106. The wicking and pooling, e.g., the formation of the fillet, may occur between application of the under fill material 106 and the curing step, for example. This wicking and pooling may be due to the high viscosity of the under fill material 106, which may be prone to wicking out from between the die 102, 104 due to gravity and surface tension. As such, as the under fill material 106 begins to wick from between the die 102, 104, the pool 110 may begin to form around the die 104 and on at least a portion of the die 102. The amount of under fill material 106 in the pool 110 may be self-limiting based on a volume of the under fill material 106 present. The volume of the under fill material 106 present may be based in part on the height of the die stack, e.g., a number of die in the plurality of die 104. For example, as the pool 110 begins to form and reaches spaces between the die from which the under fill material is wicking, the wicking from those spaces may reduce or stop. For die stack of higher numbers of die, 8 or 12 die for example, the wicking and pooling may be more pronounced because there may be more volume of the under fill material 106 to wick and pool, and also because there may be a larger distance between the forming pool 110 and spaces between adjacent die 104 from which the under fill material 106 is wicking. The wicking and pooling of the under fill material 106 may in some embodiments result in one or more heat dissipation and packaging concerns.

One concern may be the formation of voids between one or more of the die 102, 104. For example, as the under fill material 106 begins to wick out from between the die 104C and 104D, the wicking of the under fill material 106 may cause the formation of voids 108 in between the die 104C and 104D. The amount and size of the voids 108, which may be related to the amount of pooling of the under fill material 106, may be affected, e.g., increased or decreased, based on the number of die in the die stack 100. For example, if the die stack 100 includes eight die 104, then the under fill material 106 in between the upper die in the die stack may incur larger and/or more numerous voids while the amount of under fill material 106 in the pool 110 increases. The voids 108 may form areas where the heat transfer between adjacent die may be less than areas where the under fill material 106 remains, which may result in a reduction in overall heat dissipation from the die stack 100. This reduction in heat dissipation may be due to the thermal conductivity of the voids, e.g., the thermal conductivity of air, being less than the thermal conductivity of the under fill material 106, and further due to the interfaces at boundaries of the voids 108. These voids 108 may lead to a reduction in heat dissipation and an increase in die temperature.

The above concern may also be caused by the height of the die stack 100. For example, if the die stack 100 is too high for the under fill material 106 to be wicked into the spaces between the top die of the die stack, die 104C and 104D for example, the voids between the die may be due to the lack of under fill material filling the spaces. The under fill material 106 may not wick into the spaces between the top die due to the surface tension of the under fill material not being strong enough to pull the under fill material 16 up to those top die.

A second concern may be a reduction in heat transfer from the die 102 to a surrounding heat sink or heat transfer component. For example, the pool 110 may reduce heat transfer from areas of the die 102 that are under the pool 110. The reduction in heat transfer from areas under the pool 110 may be due to the large volume of the under fill 106 in conjunction with the low thermal conductivity of the large volume. As a result, a reduction in heat transfer from the die 102 may result. Further, heat generated in areas of the die 102 that may be under the die 104 may need to propagate laterally through the die 102 to exit the die 102 and/or to reach a heat sink. This lateral propagation of the heat may be affected by heat gradients that occur within the die 102. The heat gradients, however, may be affected, e.g., reduced, by the pool 110. For example, areas under the pool 110 may be at a higher temperature than they may be without the pooling effect. This increase in temperature may reduce a heat gradient that arises between areas of the die 102 under the pool 110 and hot spots occurring in the die 102 underneath the die 104. A reduction in the heat gradient may reduce the rate at which the heat propagates laterally through the die 102, which may reduce heat transfer and increase the temperature of the die 102. Further, due to a reduction in heat dissipation from the die 102, the die 104A may also experience a reduction in heat dissipation due to the extra heat retained by the die 102. A reduction in heat dissipation may result in an increase in operating temperature of the die 102, 104A. In some examples, the temperature of the die 102 and/or 104A may increase above a recommended operating temperature.

The pool 110 of the under fill material 106 may also interfere with placement of other packaging components. For example, placement of a conformal lid (not shown) may be effected by the pool 110. The conformal lid, in some embodiments, may be formed from a material having a high value of thermal conductivity, and may be placed such that an internal surface of the lid comes within close proximity of the die 102, 104 so to reduce a distance heat needs to propagate to reach a heat spreader, for example. However, if the pool 110 increases the distance between the conformal lid and the die 102, 104, the distance the heat needs to propagate increases, which may lead to an increase in the temperature of the die stack 100.

During operation, the die stack 100 may heat up due to operation of the various circuits of the die 102, 104. In some instances, hot spots may form in one or more die of the die stack 100. For example, hot spots may develop in the die 102 under the die 104A. Hot spots that develop in an area of the die 102 under the die 104A may additionally limit heat transfer from the die 104A. In order for the heat to dissipate, the heat developed in the die 102 may propagate laterally through the die 102 and through the pool 110 of the under fill material 106 to a heat dissipating component of a package, such as a heat spreader (not shown). However, due to the poor thermal conductivity of the under fill material 106, the lateral propagation of the heat may be reduced, which may lead to increased heating of the die stack 100. In some instances, the heat experienced by the die 102 and 104A may be greater than their respective recommended maximum operating temperatures.

A potential solution to limit the pooling and the creation of voids may be to include a barrier for the under fill material 106. The barrier may be formed around the die 104 and may form a dam to the wicking, or excessive wicking, of the under fill material 106, for example. As such, the barrier may eliminate or reduce the amount of wicking/pooling of the under fill material 106, which in turn may reduce or prevent the formation of voids in the under fill material 106 in the spaces between the die 104. Further, because the barrier may be in intimate contact or in close proximity to the die 102, 104, the heat dissipation of the die 102, 104 may be improved, which may improve the overall heat dissipation and thermal performance of the die stack 100.

Figure 2:
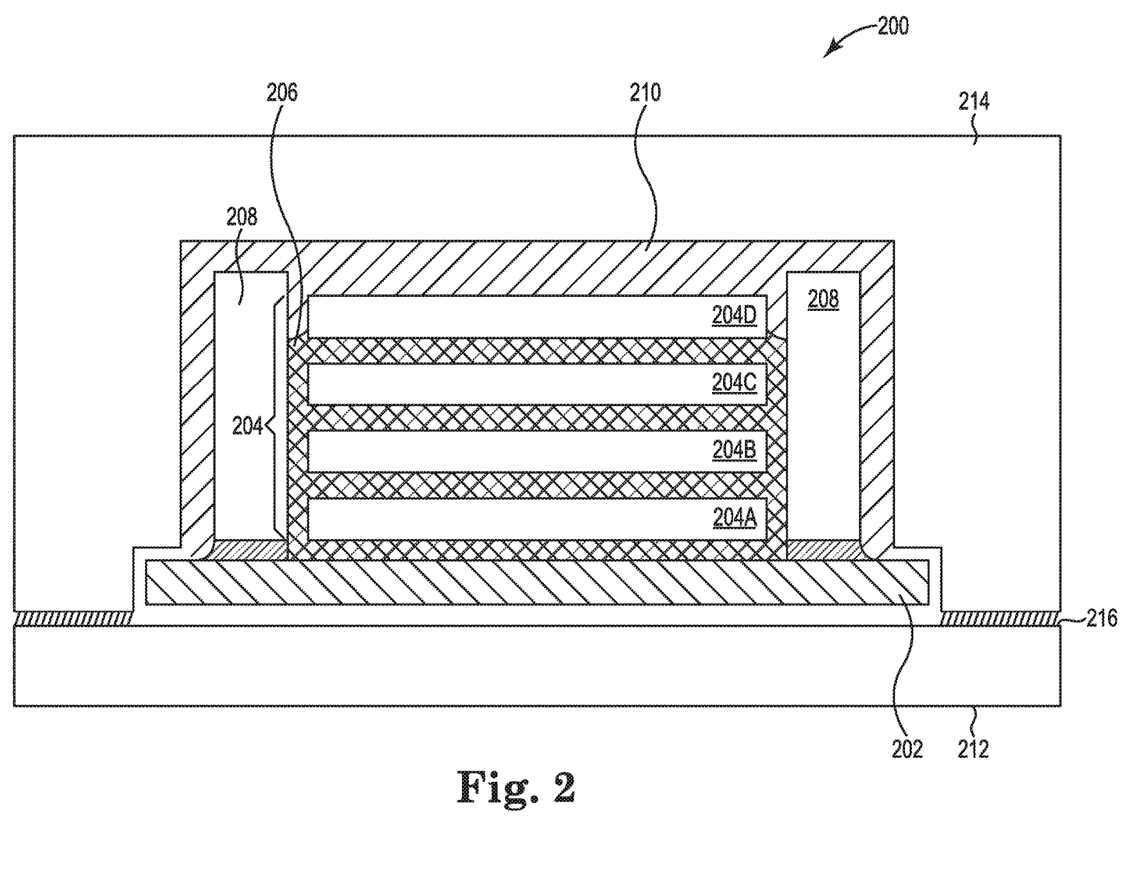
FIG. 2 is an example illustration of a cross-sectional view of a packaged die stack in accordance with the present disclosure.
Figure 3:
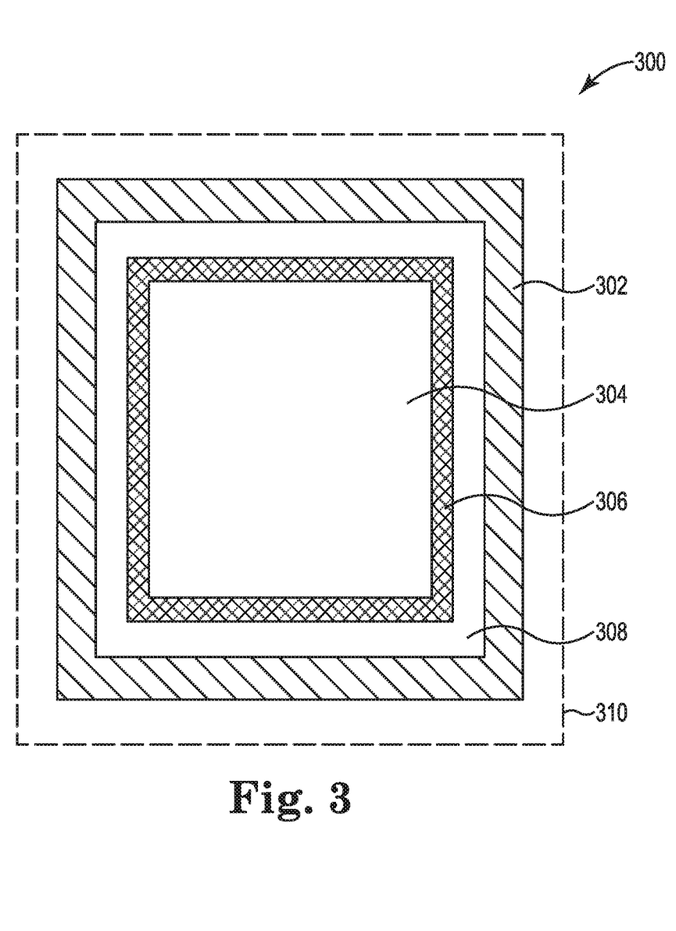
FIG. 3 is an example illustration of a plan view of a die stack in accordance with the present disclosure.

FIG. 2 is an example cross-sectional view of a packaged die stack 200 in accordance with the present disclosure. The packaged die stack 200 may include a die 202, a plurality of die 204, an under fill material 206, one or more barriers 208, a thermal interface material (TIM) 210, a substrate 212, and a lid 214. The plurality of die 204 includes individual dies 204A, 204B, 204C, and 204D. The packaged die stack 200 may be a memory device in some embodiments, but the type of device is a non-limiting aspect of the present disclosure. In some embodiments, for example, one or more of the components may not be included in the packaged die stack 200. For example, in some embodiments, the substrate 212 may be omitted. The one or more barriers 208 may be configured to enhance the thermal performance of the packaged die stack 200 through the reduction or elimination of under fill material 206 pooling and the formation of voids.

The substrate 212 may be a substrate for semiconductor packaging. The substrate 212 may be formed from a combination of organic materials, e.g., resins, glass fibers, etc., and may be non-conductive. In some embodiments, the substrate 212 may include multiple layers of electrical traces, and through-vias for electrical connections between the various layers of electrical traces, which may terminate at one or more contacts (not shown) for electrically coupling to the die 202. The lid 214 may be a cover for the packaged die stack 200 and may enclose the remaining components of the packaged die stack 200. The lid 214 may be attached to the substrate 212 by an adhesive 216, for example. In some embodiments, the lid 214 may be a heat spreader, which may promote heat dissipation into the surrounding area or to additional heat sinks (not shown).

The TIM 210 may be formed between the die 204D, exposed areas of the die 202, the one or more barriers 208, and the lid 214. The TIM 210 may be included to assist with heat transfer from the die 202, 204 to the lid 214, and may also assist in mounting, e.g., attaching, the lid 214 to the other components of the packaged die stack 200. TIM 210 may provide additional mechanical support to the die 202, 204 as well. The TIM 210 may be an epoxy material that may or may not include metal fillers, such as indium or gold, which may be included to enhance thermal conduction. The thickness of the TIM 210 may be from 20 to 50 microns, which may be dependent upon fabrication process and/or normal variations in the packaging process.

In a non-limiting example, each of the plurality of die 204 may be a memory die, such as non-volatile or volatile memory die. The die 202 may be an interface die or a logic die. The stack of die, including the plurality of die 204 and the die 202, may be interconnected by through-via interconnects (not shown), which may be a common bus for command and/or data signals to propagate within the die stack. The command and data signals may be externally provided to the stack of die by a host and data may be provided to the host in response. Additionally, the die 202 may receive data and command signals from one or more external components, and in response provide the data/command signals to a target die 204 of the plurality of die 204. The through-via interconnects may be coupled to one or more bonding pads (not shown) formed on a top side and/or a bottom side each of the die 202, 204. Additionally, the bonding pads may be locations for forming metallic bonds between adjacent die of the packaged die stack 200, analogous to the metallic bonds discussed above with reference to FIG. 1.

The die 202 may be a bottom die of the die stack 200, and may support the plurality of die 204. Additionally, each of the die 202, 204 may be separated from an adjacent die 202, 204 due at least in part to the metallic bonds coupling the die. The space between the adjacent die may be filled with the under fill material 206. Filling the spaces between the die with the under fill material 206, as discussed above, may provide structural support to the stacked die 202, 204, and may also provide some thermal dissipation support.

In the example shown in FIG. 1, the die 202 is depicted as being larger than the die 204 and this depiction may be for illustrative purposes only and is non-limiting. In some embodiments, the die 202 may be the same size as the die 204. In some embodiments, the die 202 may be larger than the die 204 in only one direction, but may be proportionate in size in a second direction. For example, a length of the die 202, as shown in FIG. 2, may be longer than a length of each of the die 204, while a width of the die 202 (not depicted) may be similar to the width of each of the die 204. The difference in size may be due to various functions the die 202 performs and the respective circuits used for such functions. The die 202 may include logic circuits and communication circuits, which may generate heat due to operation of the circuits. Heat generated by the die 202, especially if generated directly under the die 204A, may be difficult to dissipate. The difficulty in dissipation may be due in part to the distance from a heat generating area of the die 202 to the lid 214, and further by a path taken by the heat from the heat generating area to the lid 214. For example, heat generated in die 202 that is under die 204A, for example, may need to propagate laterally through the die 202 before reaching the lid 214. This lateral path taken by the heat may further include the one or more barriers 208, which may provide an improved heat transfer path.

The one or more barriers 208 may also act as a dam to the under fill material 206. The dam provided by the one or more barriers 208 may prevent or reduce the wicking and pooling of the under fill material 206, as discussed above. The one or more barriers 208 may rest upon, e.g., be supported by, or be within close proximity to a top surface of the die 202, and may be attached to the die 202 by an adhesive, for example. Further, the one or more barriers 208 may be in close proximity to the edges of each of the die 204, and may further be commensurate in height to the height of stack of the plurality of die 204. In some embodiments, the one or more barriers 208 may partially rest upon the die 202 and partially rest upon the substrate 212. For example, in an embodiment where the die 202 is a square or rectangle, the one or more barriers 208 may rest upon the die 202 along two opposite sides of the die 202 and further rest upon the substrate 212 along two remaining sides of the die 202. In some embodiments, the one or more barriers 208 may be formed on, e.g., attached to, the die 202 and/or the substrate 212, and around the die 204 before the under fill material 206 is applied in the packaging process. During the packaging process, an amount of under fill material 206 may wick out of the spaces between adjacent die 202, 204 and into an area between the edges of the die 204 and the one or more barriers 208. As such, the under fill material 206 may be contained within the confines of the one or more barriers 208, e.g., between the one or more barriers 208 and the stack of die 204, so that the wicking and pooling of the under fill material 206 is reduced and/or eliminated.

The one or more barriers 208 may further be formed in relationship to (e.g., adjacent) the plurality of die 204 so that the one or more barriers 208 form a dam for the under fill material 206. For example, the one or more barriers 208 may be placed in close proximity to the edges of the plurality of die 204 during the packaging process so that an amount of the under fill material 206 wicking and pooling during the packaging process may be reduced or eliminated. A height of the one or more barriers 208 may be proportionate to a height of the plurality of die 204, which may provide a dam to the under fill material 206 located in the spaces between the die 204. For example, by having a proportionate height as the stack of die 204, the one or more barriers 208 may reduce the amount of wicking of the under fill material 206 from the upper die in the stack, such as the die 204C and 204D. By forming a dam for the under fill material 206, the one or more barriers 208 may reduce or prevent the under fill material 206 from wicking out from the spaces between the die 204 and pooling on the die 202.

Through reduction of the wicking and pooling of the under fill material 206, the one or more barriers 208 may improve heat transfer from at least the die 202, which may reduce the temperature of the die 202. Heat transfer from areas underneath the one or more barriers 208 may be improved, which may provide a greater heat gradient in the die 202 between areas under the one or more barriers 208 and areas under the die 204A,f or example. The greater heat gradient may provide for enhanced lateral propagation of heat within the die 202, which may result in enhanced heat dissipation of the die 202. Further, enhanced heat dissipation of die 202 may lead to improved heat dissipation of the packaged die stack 200. Accordingly, by preventing the pooling of the under fill material 206 on the die 202 and by providing an enhanced thermal transfer path from the die 202 to the lid 214, the one or more barriers 208 may allow for enhanced heat transfer from at least the die 202. The enhanced heat transfer of die 202 may lead to lower operating temperature of the die 202 and potentially the packaged die stack 200.

The one or more barriers 208 may be formed from a material with high thermal conductivity, such as a metal or a semiconductor material. For example, the one or more barriers 208 may be formed from copper, copper-molybdenum (CuMo), copper-tungsten (CuW), or aluminum nitride (AlN). In some examples, the one or more barriers 208 may be formed from silicon. In some embodiments, the one or more barriers 208 may be a continuous ring formed around the die 204 and resting on, e.g., attached to, the die 202 and/or the substrate 212.

In some embodiments, the one or more barriers 208 may be formed from one or more thermoelectric coolers (TECs), e.g., Peltier effect devices. Each of the one or more TECs may be individually powered and provide active heat dissipation from the die stack. As known to those skilled in the art, each of the one or more TECs may have a cold side and a hot side. The cold side of a TEC device may actively extract heat from an adjacent component, while the hot side may provide the heat to an area a distance away from the cold side, the TIM 210 or the lid 214 for example. The cold side of each of the one or more TECs may face or be adjacent to the die 202 and/or the substrate 212, whereas the hot side of each of the one or more TECs may face the lid 214. In such an embodiment, the one or more TECs may further enhance the heat transfer from heat generated in the die 202 to the lid 214 by providing active heat transfer of heat generated in the die stack 200. Additionally, the one or more TECs may be formed into a continuous ring and placed around the die stack 200, for example.

In an embodiment where the one or more barriers 208 are formed from a plurality of TECs, the number of TECs enabled at any given moment may be based on a level of power consumption of the packaged die stack 200 or based on a temperature of the packaged die stack 200. For example, during moments when the packaged die stack 200 is operating at elevated power levels, all or a majority of the plurality of TECs may be enabled. In contrast, at times the packaged die stack 200 is operating at low levels or is in a stand by state, the number of TECs enabled may be fewer, or none of the TECs may be enabled. In some embodiments, the operating level and/or the temperature may be based at least on the operating level or the temperature of the die 202, which may determine a number of TECs enabled at any given moment. By providing control of the number of TECs operating at any given moment, the power dissipation of the packaged die stack 200 may be adjusted while still providing enhanced thermal dissipation from the die stack.

FIG. 3 is an example illustration of a plan view of a die stack 300 in accordance with the present disclosure. The die stack 300 may provide a plan view of the packaged die stack 200 with certain features removed for sake of clarity. For example, a lid, and thermal interface material are not shown in FIG. 3 so that the relation of the substrate 310, die 302, 304, and the barrier 308 are clearly shown. The die stack 300 includes a die 302, a die 304, an under fill material 306, and a barrier 308. The relative dimensions of the die 302, die 304, and barrier 308 are not to scale and FIG. 3 is for illustrative purposes only. Various relations between the die 302, 304, and the barrier 308 may be different in other embodiments. For example, in some embodiments the width of the die 304 and the die 302 may be substantially similar while the die 302 may be longer than the die 304. In such an embodiment, the barrier 308 may partially rest upon the portion of the die 302 that is longer than the die 304 and may also partially rest upon the substrate 310. In all embodiments, however, the barrier 308 may provide a dam to the wicking and pooling of under fill material 306. The barrier 308 may further provide an enhanced heat transfer path from the die 302 to a lid, such as the lid 214.

Die 302 may be a logic die or a control die for the die 304. The die 304, which may represent a stack of multiple die, four die for example, may be one or more memory die. The die 302 and 304, for example, may be similar to the die 202, 204 of FIG. 2. Additionally, the die 302 and 304 may be configured, e.g., mechanically and electrically coupled, similar to the die 202, 204. For example, the die 302, 304 may be electrically and physically coupled by metallic bonds. The metallic bonds may cause the die to be separated, e.g., spaces between the die, that may be filled with the under fill material 306.

In a non-limiting example, the barrier 308 may form a continuous ring around the die 304, e.g., encircles at least the die 304. The barrier 308 may be formed from metal or a non-metallic material having a relatively high thermal conductivity. For example, the barrier 308 may be formed from silicon. The barrier 308 may be formed of a high thermal conductivity material so to provide enhanced thermal dissipation of the die stack 300. For example, the barrier 308 may enhance the thermal transfer path for heat generated in the die 302, 304. The enhanced thermal transfer path may be an improvement over the under fill material 306 and a thermal interface material (not shown) that may fill a packaging volume between the die 302, 304 and a lid (not shown). In some examples, the barrier 308 may be formed from one or more TECs. Using one or more TECs may provide active cooling to the die stack 300.

Additionally, the barrier 308 may act as a dam to the under fill material 306. For example, during packaging of the die stack 300, the barrier 308 may be placed on the die 302 surrounding the die 304 before the under fill material 306 is applied. In this manner, the barrier 308 may prevent or reduce the under fill material 306 from wicking out from the spaces between the die 302, 304, and pooling around the base of the die 304 on portions of the die 302.

During a packaging process, the under fill material 306 may be applied to the die stack 300 after the die stack is formed and after formation or placement of the barrier 308. By placing the barrier 308 on the die stack 300 before applying the under fill material 306, the wicking and pooling of the under fill material 306 may be reduced or eliminated. For example, the under fill material 306 may be applied to the top of the die 304 so that the under fill material 306 may be contained within the barrier 308. The die stack with the under fill material 306 may then be subjected to a heat process so that the under fill material 306 cures, e.g., hardens. The cured under fill material 306 may provide structural integrity to the die stack and may also slightly enhance the heat transfer since it would be in contact with the die stack and is a better heat conductor than air.

Figure 4:
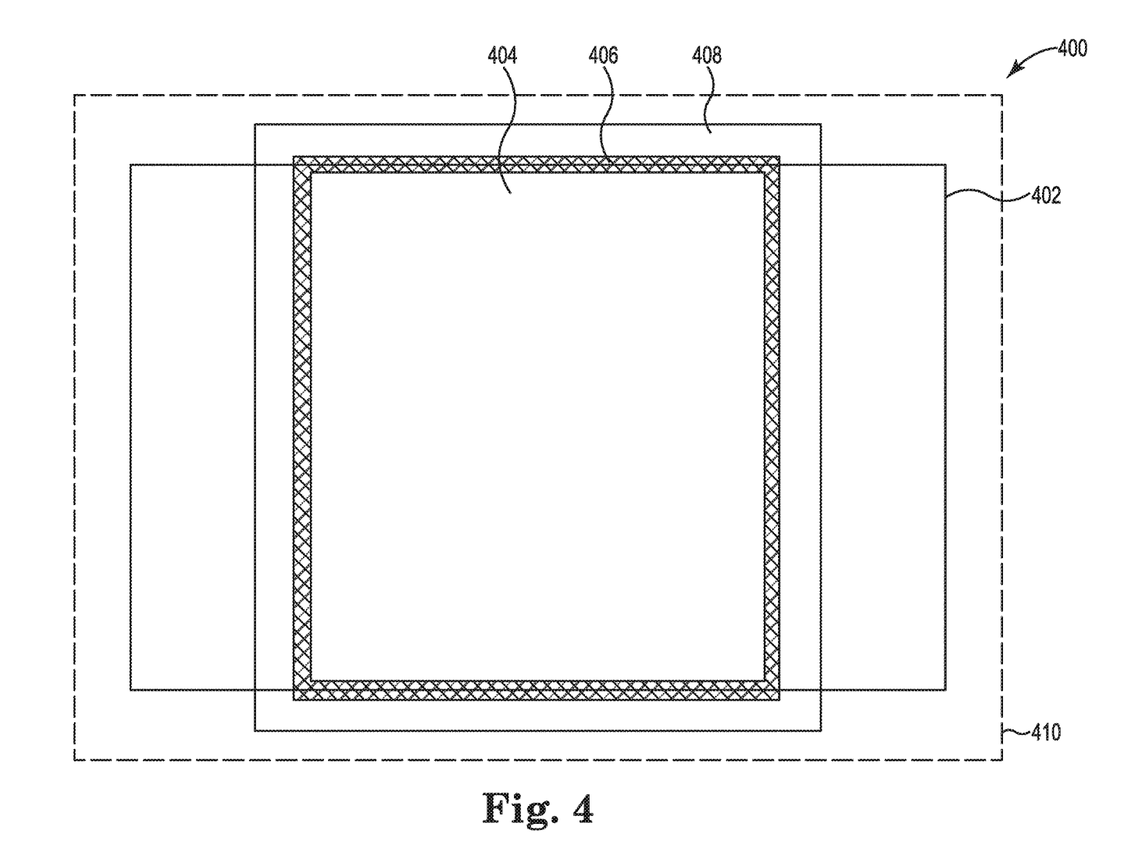
FIG. 4 is an example illustration of a plan view of a packaged die stack in accordance with the present disclosure.

FIG. 4 is another example illustration of a plan view of a packaged die stack 400 in accordance with the present disclosure. Some of the packaging components have been omitted from FIG. 4 so as not to obscure various aspects depicted. For example, a lid and thermal interface material have been omitted. The packaged die stack 400 may include a substrate 410, a die 402, a die 404, under fill material 406, and a barrier 408. The packaged die stack 400 may represent an embodiment where a width of the die 402 and 404 are substantially similar, but their respective lengths are different.

The die 402 may be a logic die or a controller die, which may be electrically and mechanically coupled to the die 404. The die 404, which may represent a stack of multiple die, may be a memory die. For example, the die 404 may represent a stack of 8 memory die. Similar to FIG. 2, the die 402 and 404 may be separated such that spaces of 30 to 50 microns exist between adjacent die of the die 402, 404. During a packaging process, the die stack 400 may have the under fill material 406 applied to provide structural support for the die stack 400. The barrier 408, which may be included in the packaging process before application of the under fill material 406, may provide a dam to the under fill material 406 and may further provide enhanced thermal dissipation of the die 402, 404.

In the embodiment of FIG. 4, the die 402 may be longer than the die 404 in one direction, but substantially the same size as the die 404 in another direction. In such an embodiment, the barrier 408 may rest upon the die 402 where the die 402 is longer than the die 404. However, the barrier 408 may rest upon the substrate 410 where the die 402, 404 are substantially the same size. Due to potential height differences between the substrate 410 and the die 402, the barrier 408 may be formed from multiple pieces. For example, the barrier 408 may be formed from one piece on each side of the die 404. In some embodiments, the barrier 408 pieces that rest upon the die 402 may be formed from one or more TECs, while the barrier 408 pieces that rest upon the substrate 410 may be formed from silicon or copper. In such an embodiment, the barrier 408 pieces resting on the substrate 410 may provide the dam function while the barrier 408 pieces on the die 402 provide the dam function and active cooling.

The die stacks depicted in FIGS. 1 and 2 are for illustrative purposes only and are not limiting. All possible variations in the number of die in the stack and the types of die in the stack are within the scope of the present disclosure. For example, an interposer die may be inserted between a die 104A and the die 102, for example, which may provide further structural stability and thermal enhancement.

From the foregoing it will be appreciated that, although specific embodiments of the disclosure have been described herein for purposes of illustration, various modifications may be made without deviating from the spirit and scope of the disclosure. Accordingly, the disclosure is not limited except as by the appended claims.

What is claimed is:
1. An apparatus, comprising:
   a substrate;
   a logic die on the substrate;
   a plurality of memory dies in a stack on the logic die;
   a barrier in close proximity to at least an edge of each of the plurality of memory dies and supported, at least in part, by the substrate and the logic die;
   a fill material in spaces between adjacent dies of the plurality of memory dies and in between the plurality of memory dies and the barrier, the fill material disposed continuously from at least an edge of a memory die of the plurality of memory dies to at least another edge of another memory die of the plurality of memory dies, the edge of the memory die facing a first side of the barrier, and the other edge of the memory die facing the first side of the barrier, wherein the barrier encloses the fill material; and
   a thermal interface material disposed over a top and a second side of the barrier, the thermal interface material also being disposed partly between an edge of at least one memory die of the plurality of memory die, the at least one memory die facing the first side of the barrier.

2. The apparatus of claim 1, wherein the logic die supports the plurality of memory dies and at least a portion of the barrier.

3. The apparatus of claim 2, wherein a portion of the barrier not supported by the logic die is supported by the substrate.

4. The apparatus of claim 3, wherein the barrier encircles the plurality of memory dies, and wherein the barrier is in close proximity to edges of each of the plurality of memory dies.

5. The apparatus of claim 1, wherein the barrier is a thermal electric cooler.

6. The apparatus of claim 1, wherein each of the plurality of memory die are volatile memory, non-volatile memory, or combinations thereof.

7. The apparatus of claim 1, wherein the barrier is configured to limit wicking of the fill material from the spaces between adjacent die of the plurality of memory die.

8. An apparatus, comprising:
   a first die;
   a plurality of second dies including a top die, wherein the first die and the plurality of second dies are arranged in a stack such that the first die supports the plurality of second dies; and
   a barrier formed on at least a portion of the first die and adjacent to the plurality of second dies, wherein the barrier limits an amount of a fill material wicking from spaces between the plurality of second dies; and a thermal interface material disposed over a top and a first side of the barrier, the thermal interface material also being disposed partly between an edge of the top die facing a second side of the barrier.

9. The apparatus of claim 8, wherein the barrier encircles the plurality of second dies, and wherein some of the fill material fills a space between an edge of the plurality of second dies and the barrier.

10. The apparatus of claim 9, wherein the barrier is formed from a plurality of thermoelectric coolers.

11. The apparatus of claim 10, wherein a number of the plurality of thermoelectric coolers enabled is variable.

12. The apparatus of claim 11, wherein the number of the plurality of thermoelectric cooler is configured to be enabled based on a temperature of at least the first die.

13. The apparatus of claim 11, wherein the number of the plurality of thermoelectric cooler is configured to be enabled based on a level of power consumption of at least the first die.

14. The apparatus of claim 8, wherein the first die is a logic die and the plurality of second dies is a plurality of memory dies.

15. The apparatus of claim 8, wherein a substrate supports the first die, the plurality of second dies, and the barrier, and a lid coupled to the substrate and configured to enclose the first die, the plurality of second dies, and the barrier.

16. The apparatus of claim 8, wherein the areas that are not filled with the fill material include an exposed area between the side of the top die and over the barrier, and wherein the areas that are not filled with the fill material further include an exposed area above the top die and below a lid of the apparatus.

17. An apparatus, comprising:
a plurality of dies arranged in a stack on a substrate, wherein adjacent dies in the plurality of dies are separated by respective spaces;
a barrier formed, at least in part, on the substrate, to encircle the plurality of dies, formed on a bottom die of the plurality of dies, and in close proximity to edges of each of the plurality of dies;
a fill material in the respective spaces and between the edge of at least one die of the plurality of dies and the barrier, the fill material disposed between a first side of the barrier and an edge of the at least one die of the plurality of dies, the edge of the at least one die facing the first side of the barrier, wherein the barrier encloses the fill material; and
a thermal interface material disposed over a top and a second side of the barrier, the thermal interface material also being disposed partly between an edge of a die of the plurality of dies, the edge of the die facing the first side of the barrier.

18. The apparatus of claim 17, wherein the length or width of the bottom die of the plurality of dies is larger than any other corresponding length or corresponding width of any die of the plurality of dies.

19. The apparatus of claim 17, wherein at least a first portion of the barrier is supported by the bottom die.

20. The apparatus of claim 19, wherein a second portion of the barrier is supported by the substrate, wherein the substrate is attached to the bottom die.

21. The apparatus of claim 17, wherein the barrier comprises a material of high thermal conductivity.

22. The apparatus of claim 21, wherein the material is a metal or a non-metallic material.

23. The apparatus of claim 17, wherein the barrier is configured to limit an amount of the fill material pooling from spaces between the plurality of dies.

* * * * *